United States Patent [19]
Haga et al.

[11] Patent Number: 6,133,521
[45] Date of Patent: Oct. 17, 2000

[54] SOLAR BATTERY OUTPUT SECTION AND ITS METHOD OF MANUFACTURE

[75] Inventors: Takahiro Haga, Sumoto; Nobuo Hanehira, Mihara-gun; Hiroyuki Mori, Somuto; Masanori Kaji, Sumoto; Masayoshi Ono, Sumoto; Masato Nishikuni, Tuna-gun; Yoshinobu Takabatake, Sumoto, all of Japan

[73] Assignee: Sanyo Electric Co., Ltd., Osaka, Japan

[21] Appl. No.: 09/038,134

[22] Filed: Mar. 11, 1998

[30] Foreign Application Priority Data

Mar. 13, 1997 [JP] Japan .................................. 9-059451

[51] Int. Cl.$^7$ .................................................. H01L 31/00
[52] U.S. Cl. ........................... 136/256; 136/251; 438/64; 438/83; 438/98
[58] Field of Search .................... 136/243, 244, 136/251, 256; 438/64, 83, 98

[56] References Cited

U.S. PATENT DOCUMENTS

| | | | |
|---|---|---|---|
| 3,770,565 | 11/1973 | Schoolar et al. | 428/413 |
| 4,754,544 | 7/1988 | Hanak | 438/66 |
| 5,017,243 | 5/1991 | Otsubo | 136/244 |
| 5,296,043 | 3/1994 | Kawakami et al. | 136/244 |
| 5,421,908 | 6/1995 | Yoshida et al. | 136/244 |
| 5,626,686 | 5/1997 | Yoshida et al. | 136/244 |
| 5,660,646 | 8/1997 | Kataoka et al. | 136/251 |
| 5,717,255 | 2/1998 | Haga et al. | 257/781 |

FOREIGN PATENT DOCUMENTS

| | | | |
|---|---|---|---|
| 60-123073 | 7/1987 | Japan | H01L 31/04 |
| 64-36084 | 2/1989 | Japan | H01L 31/04 |
| 7-231015 | 8/1995 | Japan | H01L 21/60 |

*Primary Examiner*—Mark Chapman
*Attorney, Agent, or Firm*—Wenderoth, Lind & Ponack, L.L.P.

[57] ABSTRACT

The solar battery output section has a hole provided through the substrate and through an output terminal formed on the front-side of that substrate. Metal foil is applied covering the hole on the backside of the substrate. The inside of the hole is filled with conducting material to electrically connect the output terminal and the metal foil. Finally, a protective resin film is applied over the substrate, and a wire lead is solder attached to the metal foil on the backside of the substrate.

29 Claims, 11 Drawing Sheets

PRIOR ART

SOLAR BATTERY OUTPUT SECTION AND ITS METHOD OF MANUFACTURE

BACKGROUND OF THE INVENTION

This invention relates to the structure of, and method of manufacturing, a solar battery output section for the purpose of extracting output from a solar battery device.

Prior art solar battery output sections have adopted structures as shown in FIG. 16 using a method of manufacture as follows. In FIG. 16, 301 is an insulating substrate made from resin material. On top of this substrate 301, conductive epoxy 302, a metal electrode layer 303, an amorphous silicon semiconductor layer 304, a transparent conductive film layer 305, conductive epoxy 306, and copper epoxy 307 are formed in layers. This region of the solar battery functions as an output terminal 300. After these layers are formed, a hole 308 is provided through the substrate 301 at the output terminal 300 of the solar battery. A thin metal foil 309 is then soldered above the copper epoxy 307 to cover the hole 308 via a solder layer 310.

Next, a protective resin film 311, which is covered on one side with an adhesive layer of resin that becomes plastic with heat (not illustrated), is applied with pressure and heat over the substrate 301 including the output terminal(s) 300. The entire solar battery is then flipped over and a wire lead 313 is soldered to the metal foil 309 via solder 312 within the hole 308. Fabrication of a prior art solar battery output terminal region is thereby completed by the processing steps described above.

The following problems exist with the prior art solar battery output section described above.

(1) When the entire solar battery is flipped over and a wire lead 313 is soldered to the metal foil 309, solder heat is transmitted to the metal foil 309. The protective resin film 311 covering the metal foil 309 is melted by that heat.

(2) Because of the thickness of the solder layer 310 and metal foil 309, and the thickness of the multi-layer structure of solder layer 310, metal foil 309, and copper epoxy 307, a large step results, and the protective resin film 311 can easily delaminate in this region (X in FIG. 16). Since this delamination is located on the light-receiving surface of the solar battery, it is undesirable from the standpoint of external appearance.

(3) To increase the electric power producing area of the solar battery, it is preferable for the hole 308, which is a non-electric power producing element, to be as small as possible. However, solder attachment of a wire lead 313 into a small hole 308 results in poor manufacturability.

The present invention was realized to solve these problems. The object of the present invention is to provide a solar battery output section and its method of manufacture wherein output is pulled from solar battery devices at the backside of the substrate, the protective resin film does not melt when wire leads are solder attached, the protective resin film does not delaminate, and manufacturability of the solder attachment process is good.

The above and further objects and features of the invention will be more fully apparent from the following detailed description, along with the accompanying drawings.

SUMMARY OF THE INVENTION

The primary structural elements of a solar battery output section of the present invention are as follows. A hole, which passes through a substrate, is provided through an output terminal formed on the front-side of the substrate. Thin metal foil is fixed on the backside of the substrate covering the hole, and conducting material is disposed within the hole to electrically connect the output terminal and the metal foil. Next, protective resin film is formed over the substrate, and a wire lead is solder attached onto the metal foil on the backside of the substrate.

A solar battery output section with this structure allows output from the output terminal on the front-side of the substrate to be extracted from the backside. In addition, since the metal foil is fixed to the backside of the substrate, protective resin film on the front-side does not melt due to solder heat during solder attachment of the wire lead on the metal foil.

Further, there is no metal foil on the front-side surface of the output terminal. Consequently, there is no delamination of protective resin film due to a step created at the metal foil as noted for prior art. Therefore, external appearance is good.

Still further, since the wire lead can be solder attached to any location on the metal foil, the solder attachment point is not constrained as noted for prior art, and the solder attachment operation is simple to perform. In addition, since the metal foil is disposed on the backside, there is no reduction in electric power producing solar battery area on the front-side even if metal foil area is made large. A large metal foil area makes the solder attachment operation even easier to perform.

DETAILED DESCRIPTION OF THE INVENTION

Figure 1:
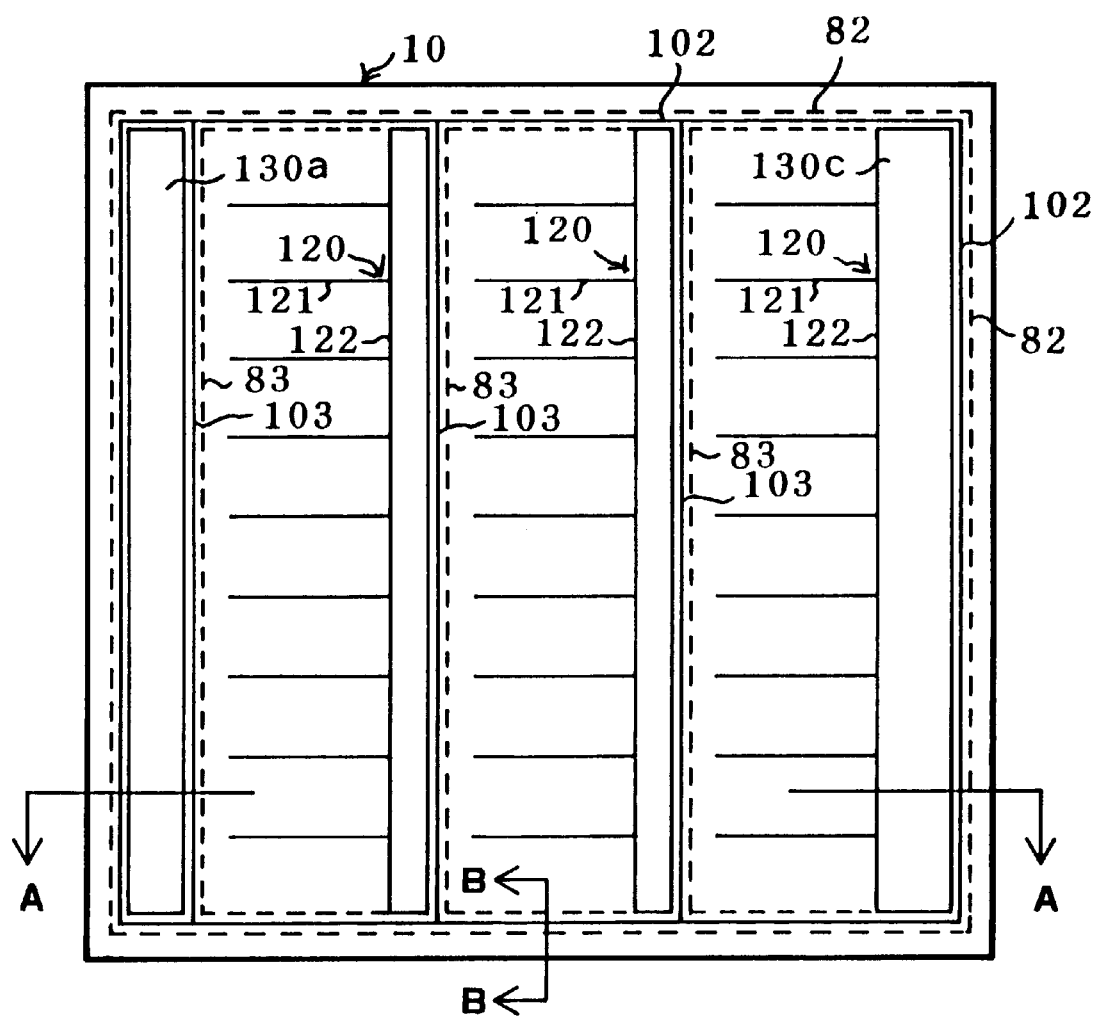
FIG. 1 is a plan view showing the first step in the manufacture of the first embodiment of the present invention.
Figure 2:
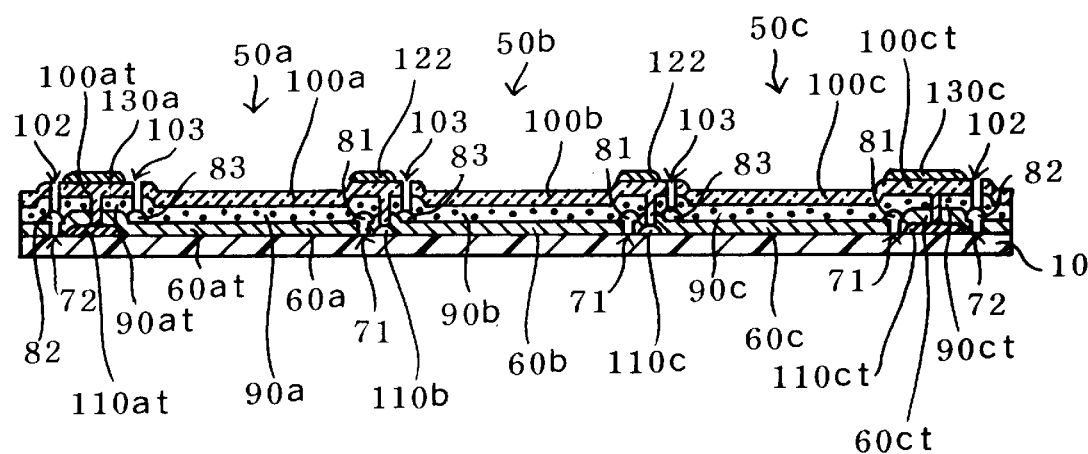
FIG. 2 is a cross-section view at location A—A in FIG. 1.
Figure 3:
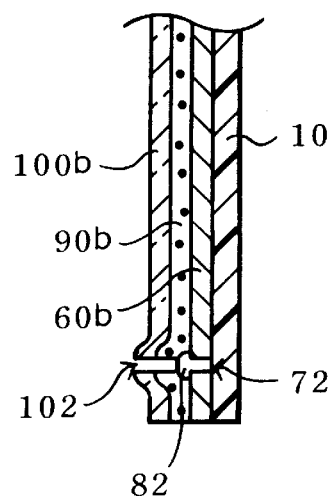
FIG. 3 is a cross-section view at location B—B in FIG. 1.

The following is a detailed description based on FIGS. 1 through 11 of the solar battery of the first embodiment of the present invention. FIGS. 1 through 3 show the first embodiment during manufacture, and this description is the same as that disclosed by Japanese Patent HE17-231015 (1995).

In the figures, 10 is an insulating film substrate made from flexible heat resistant resin such as polyimide. 50a through 50c are a plurality of electric power producing active areas fabricated on the substrate 10, and 60a through 60c are regions of the first electrode layer partitioned corresponding to each of the power producing active areas 50a through 50c on the substrate 10. These first electrode regions 60a through 60c are single layer metal film structures such as aluminum, titanium, nickel, copper, etc., or multi-layer laminate metal film structures such as aluminum/titanium (formed on the substrate 10 in the order recited), tungsten/aluminum/titanium (formed on the substrate 10 in the order recited), etc. First electrode regions 60a through 60c are partitioned after global formation of metal film over the entire substrate 10. The partitioning is accomplished by laser cuts to form partition trenches 71 between active areas 50a through 50c, and at the right end of active area 50c, and to form perimeter trenches 72 around the inside of the entire perimeter region of the substrate 10.

81 is insulating epoxy disposed in the partition trenches 71 and bridging both sides of the metal film. 82 is insulating epoxy disposed in the perimeter trenches 72 and bridging both sides of the metal film. 83 is insulating epoxy disposed over each left edge of each first electrode region 60a through 60c. The insulating epoxy of 81, 82, and 83 is a polyimide or phenol-system binder which includes powdered inorganic material such as silicon dioxide, etc. The insulating epoxy 81, 82, and 83 is patterned by screen printing, and subsequently baked at 250° C. to 300° C. to form lines approximately 0.4 to 0.6 mm wide.

90a through 90c are pn or pin doped light-active semiconductor layers of amorphous silicon, amorphous silicon carbide, amorphous silicon germanium, etc. partitioned and disposed over the first electrode layers 60a through 60c. 100a through 100c are transparent conducting film second electrode layers of zinc oxide (ZnO), tin indium oxide (ITO), tin oxide ($SnO_2$), etc. partitioned and disposed over the light-active semiconductor layers 90a through 90c. The second electrode layer of transparent conducting film is formed over the entire surface on top of the light-active semiconductor layer also formed over the entire surface. Each light-active semiconductor layer 90a through 90c and each second electrode layer 100a through 100c are established and partitioned by laser cuts to form partition trenches 102 and 103 above the insulating epoxy 82 and 83.

The power producing active areas 50a through 50c have conducting epoxy, such as silver epoxy, 110b and 110c disposed between first electrode layers 60b and 60c and the substrate 10 at the left edges of the first electrode regions 60b and 60c. This is for the purpose of achieving an electrical connection between adjacent power producing active areas. Disposed above the conducting epoxy 110b and 110c are the light-active semiconductor layers 90a and 90b and the second electrode layers 100a and 100b, respectively. A laser beam is shone onto this stack to laser-weld the second electrode layers 100a and 100b and the conducting epoxy 110b and 110c respectively to form an electrical connection. These laser-welds connect each power producing active area 50a through 50c corresponding to each solar battery device in series. The conducting epoxy 110b and 110c is a polyimide or phenol-system binder which includes powdered material such as silver, nickel, or aluminum, etc. The conducting epoxy is patterned by screen printing, and subsequently baked at 250° C. to 300° C. to form lines approximately 0.4 to 0.6 mm wide.

120 are collecting electrodes made up of a plurality of branch elements 121 parallel to the array direction of the power producing active areas 50a through 50c and main regions 122 continuing from the right ends of these branch elements 121. The collecting electrode main regions 122 are shaped as bands positioned above the conducting epoxy 110b and 110c. The collecting electrode 120 main region located at the right edge also serves as output terminal 130c described later.

In the solar battery output section located at the left edge of the array, 60at is a first electrode extension which is a projection of the first electrode layer 60a beyond the active area 50a. 110at is conducting epoxy shaped as a band extending parallel to the left edge and disposed between the first electrode extension 60at and the substrate 10. 90at is semiconductor film located above the conducting epoxy 110at, and is formed of the same material and during the same fabrication step as the light-active semiconductor layer. 100at is the second electrode pad located above the semiconductor film 90at with approximately the same shape as 90at, and formed of the same material and during the same fabrication step as the transparent conducting film second electrode layer. Here, a laser beam is shone onto the second electrode pad 100at to laser-weld and electrically connect the second electrode pad 100at and the conducting epoxy 110at. 130a is an output terminal of conducting epoxy extending parallel to the left edge formed over the second electrode pad 100at, and formed of the same material and by the same method as conducting paste 110b and 110c described above.

At the other end, in the solar battery output section located at the right edge of the array, 60ct is the first electrode pad and is an island at the right end of the first electrode layer 60c of the active area 50c. 110ct is conducting epoxy shaped as a band extending parallel to the right edge and disposed between the first electrode pad 60ct and the substrate 10. 90ct is semiconductor film which is an extension of the light-active semiconductor layer 90c located above the first electrode pad 60ct. 100ct is a second electrode extension which is a projection of the second electrode layer 100c formed on top of the semiconductor film 90ct. Here, a laser beam is shone onto the second electrode extension 100ct to laser-weld and electrically connect the second electrode extension 100ct and the conducting epoxy 110ct. This is done to reduce resistance and improve electrical power collecting efficiency. 130c is an output terminal of conducting epoxy extending parallel to the right edge formed over the second electrode extension 100ct, and is formed of the same material and by the same method as conducting paste 110b and 110c described above.

The following description concerns a characteristic of the present invention which is the method of manufacture of the solar battery output section. FIGS. 4 through 11 describe the manufacturing steps of a solar battery output section located in the lower left of the solar battery array. The manufacturing steps of a solar battery output section located in the lower right are the same and are omitted for brevity.

Figure 4:
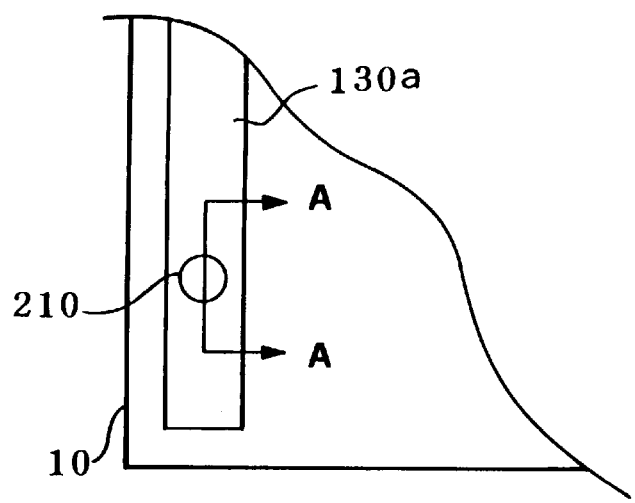
FIG. 4 is a plan view showing important elements of the second step in the manufacture of the first embodiment of the present invention.
Figure 5:
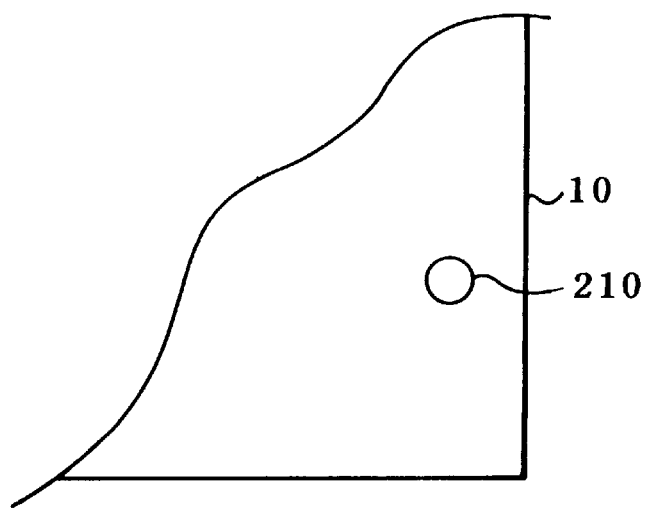
FIG. 5 is A backside view of FIG. 4.
Figure 6:
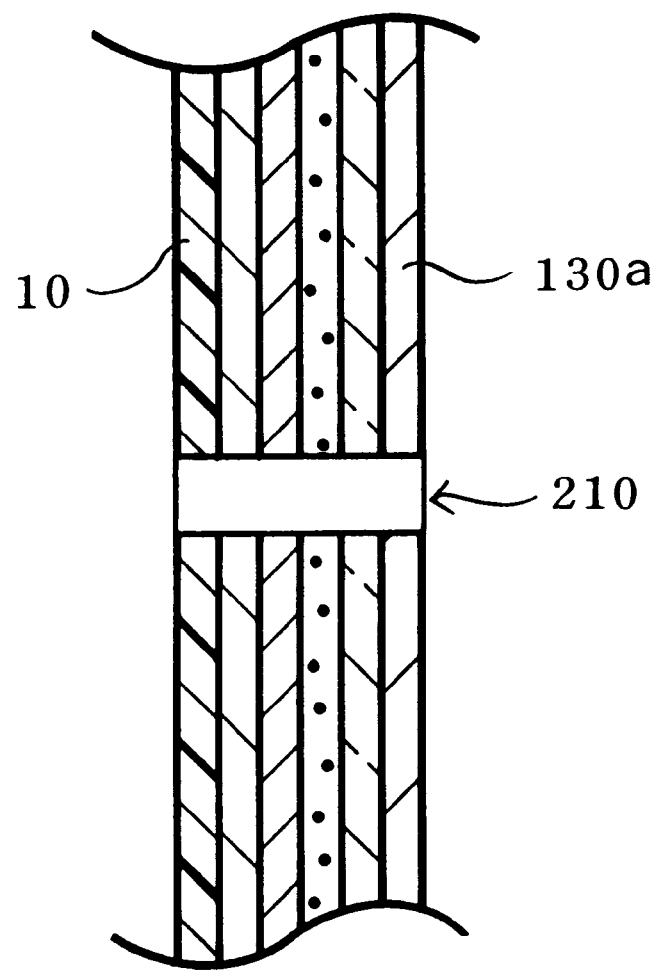
FIG. 6 is a cross-section view at location A—A in FIG. 4.

In the manufacturing steps shown by FIGS. 4 through 6, a roughly circular through-hole 210 (approximately 1 mm in diameter) is provided through the output terminal 130a of the solar battery and through the substrate 10.

Figure 7:
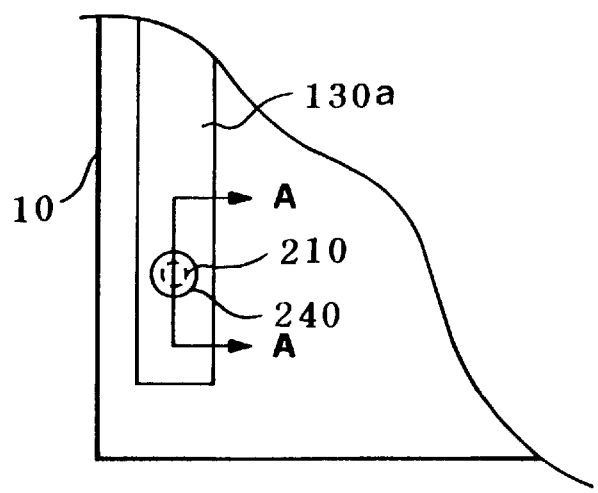
FIG. 7 is a plan view showing important elements of the third step in the manufacture of the first embodiment of the present invention.
Figure 8:
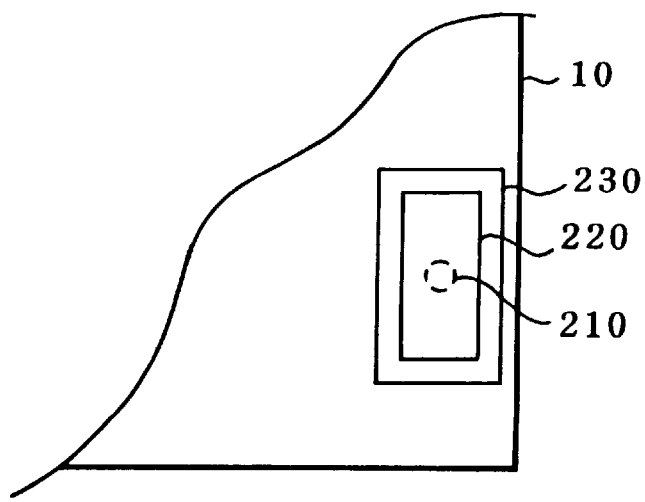
FIG. 8 is backside view of important elements of FIG. 7.
Figure 9:
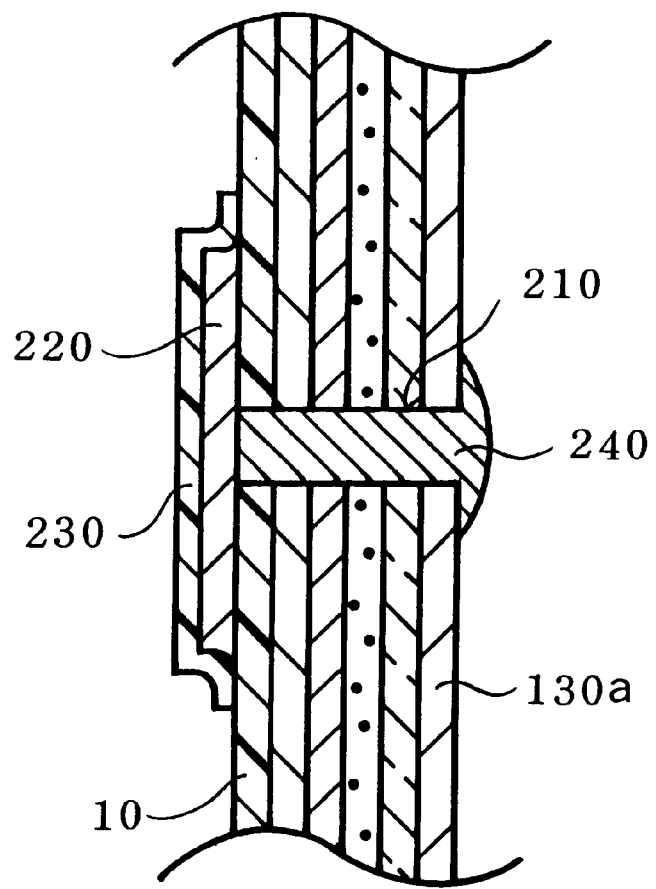
FIG. 9 is a cross-section view at location A—A in FIG. 7.

Next, in the manufacturing steps shown by FIGS. 7 through 9, rectangular shaped metal foil 220 is put in place on the backside of the substrate 10 covering the hole 210. The metal foil 220 is fixed in place with rectangular shaped adhesive tape 230 disposed to cover the metal foil 220. This adhesive tape 230 is a transparent polyethylene terephthalate film (PET) with an adhesive layer on one side. Here, the metal foil 220 is copper with its front-side plated with solder.

The output terminal 130a and the metal foil 220 are electrically connected by introducing a conducting material 240 (which is conducting epoxy) from the front-side of substrate 10 into the hole 210. The conducting material 240 has a head formed at each hole 210 which extends outward from hole 210 over the surface of the output terminal 130a. Here, the conducting material is the same material as the conducting paste 110b and 110c described above, and is applied via a dispenser.

Figure 10:
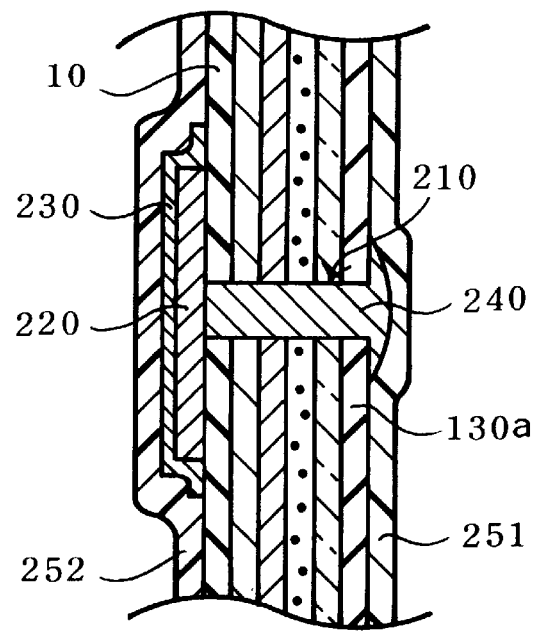
FIG. 10 is a cross-section view showing important elements of the fourth step in the manufacture of the first embodiment of the present invention.

Next, in the manufacturing steps shown by FIG. 10, a front-side protective resin film 251 and a backside protective resin film 252, in the form of transparent films, are applied over the entire front surface of the solar battery array and over the entire backside of the substrate 10. These protective resin films 251 and 252 are made of polyethylene terephthalate (PET), fluorine resin material, etc. These film sheets have an adhesive layer (not illustrated) of resin (which plasticizes, or becomes plastic, with heat) attached to one side. The film sheets are applied by passage through heat rollers which simultaneously laminate the solar battery array with the front-side protective resin film 251 and the backside protective resin film 252. Instead of this lamination method, the film sheets may also be applied by a vacuum heat pressure attachment method where they are applied with pressure while adding heat in a vacuum. Ethylene-vinyl acetate copolymer (EVA), PVB, etc. can be used as the adhesive layer of these film sheets.

Further, to reduce moisture ingress to the substrate 10 from around its perimeter, the area of the front-side protective resin film 251 and the backside protective resin film 252 may be configured larger than the area of the substrate 10, and the two protective resin films may be hermetically sealed together outside the perimeter of the substrate 10.

Figure 11:
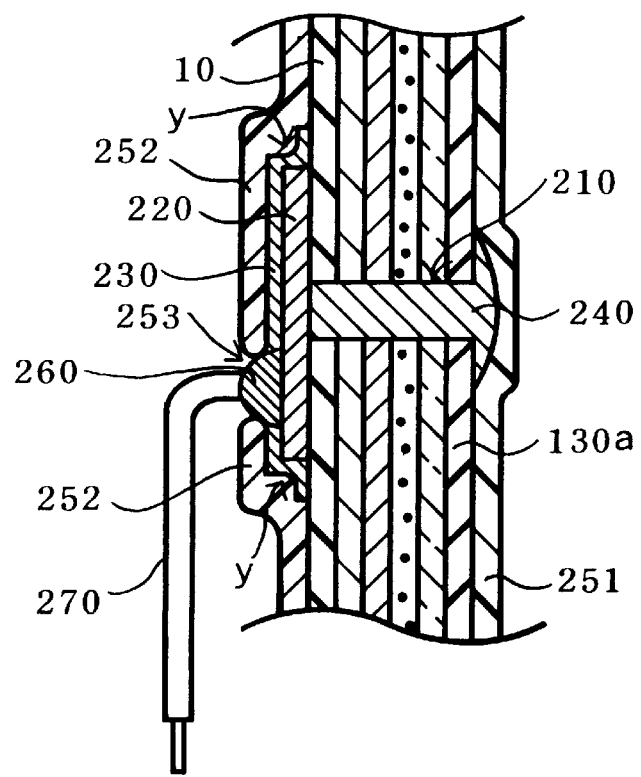
FIG. 11 is a cross-section view showing important elements of the fifth step in the manufacture of the first embodiment of the present invention.

Finally, in the manufacturing steps shown by FIG. 11, a solder spot 260 is formed. The solder spot 260 is provided on the backside of the substrate 10, on the metal foil 220, and is not positioned under the conducting material 240. By applying a soldering iron to the backside protective resin film 252 and melting solder at the solder spot, the backside protective resin film 252 and the adhesive tape 230 melt and are either displaced or vaporized to provide a hole 253 for the wire lead. Subsequently or when the solder spot is formed, a wire lead 270 is solder attached to the solder spot 260 to complete the present embodiment.

In the embodiment described above, since the wire lead 270 is solder attached on the metal foil 220 at a location not (i.e., offset from) under the conducting material 240, vibration and shock from the solder operation is not directly transmitted to the interface joining the metal foil 220 and the conducting material 240. Therefore, the connection between the metal foil 220 and the conducting material 240 is not disrupted by soldering, and as a result conduction failure does not occur. If the wire lead were soldered to the metal foil at a position under the conducting material, since the conducting material containing metal constituents and the metal foil are good heat conductors, conduction of solder heat to the front-side and melting of the front-side protective resin film would be a concern. In the embodiment described above, little heat is conducted as far as the front-side protective resin film 251 because the wire lead 270 is solder attached on the metal foil 220 at a location not under the conducting material 240.

Further, in the above embodiment, metal foil 220 is attached to the backside of the substrate 10 with adhesive tape 230. Compared to the prior art structure of metal foil solder attachment via a solder layer, the metal foil 220 structure of this embodiment results in a smaller step (Y in FIG. 10). Consequently, delamination of the backside protective resin film 252 due to the step Y occurs very rarely. Finally, in the above embodiment, adhesive tape 230 is disposed at the step Y and this smoothes the step and further reduces the occurrence of backside protective resin film 252 delamination at this location.

Figure 12:
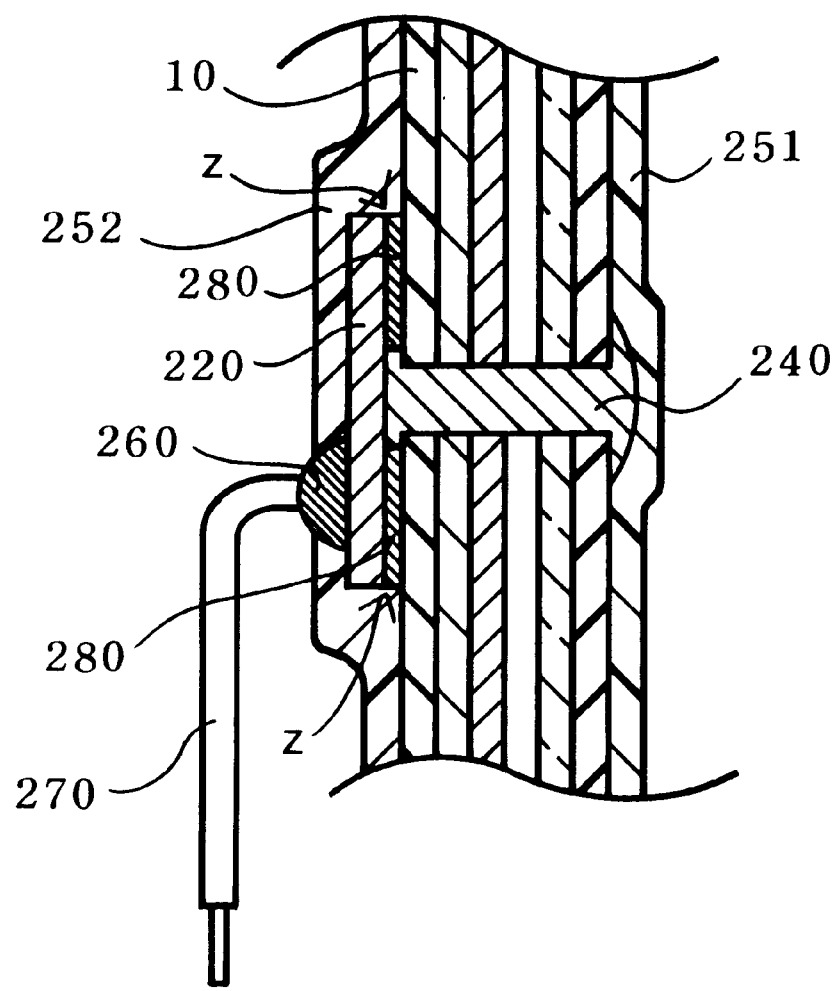
FIG. 12 is a cross-section view showing important elements of the second embodiment of the present invention.

The second embodiment of the present invention is described using FIG. 12. Here, descriptions concerning elements which are the same as the first embodiment are omitted and only elements which differ are described. This embodiment discloses a method of metal foil 220 attachment which differs from that of the first embodiment. In FIG. 12, except for the region in contact with the conducting material 240, the metal foil 220 is attached to the substrate 10 via an adhesive layer 280. In this embodiment, a step (Z in FIG. 12) is created by the metal foil 220 and the adhesive layer 280 laminate. However, the adhesive layer of the backside protective resin film 252 and the substrate 10 are made of the same resin, and their mutual adhering strength is good. Therefore, it is difficult for the backside protective resin film 252 to delaminate due to the step Z.

Figure 13:
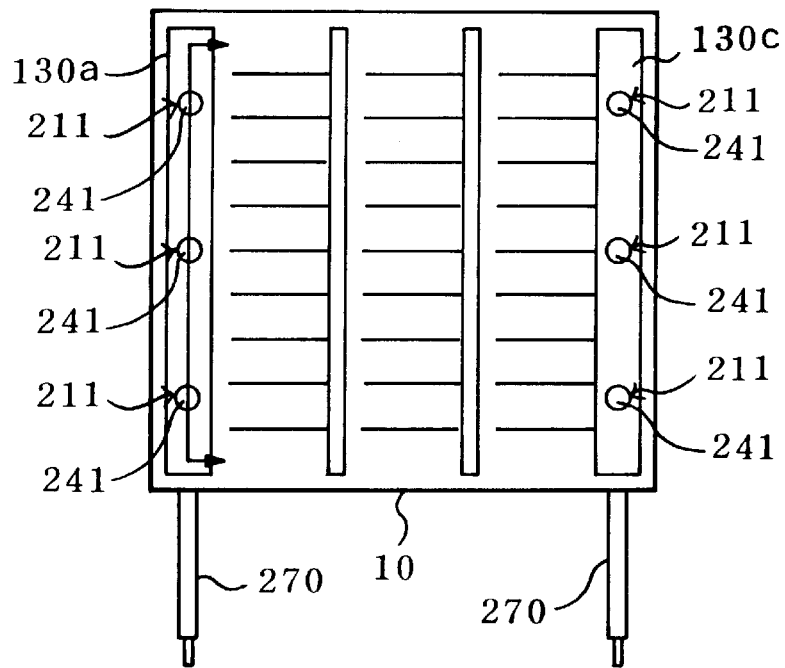
FIG. 13 is a plan view showing the third embodiment of the present invention.
Figure 14:
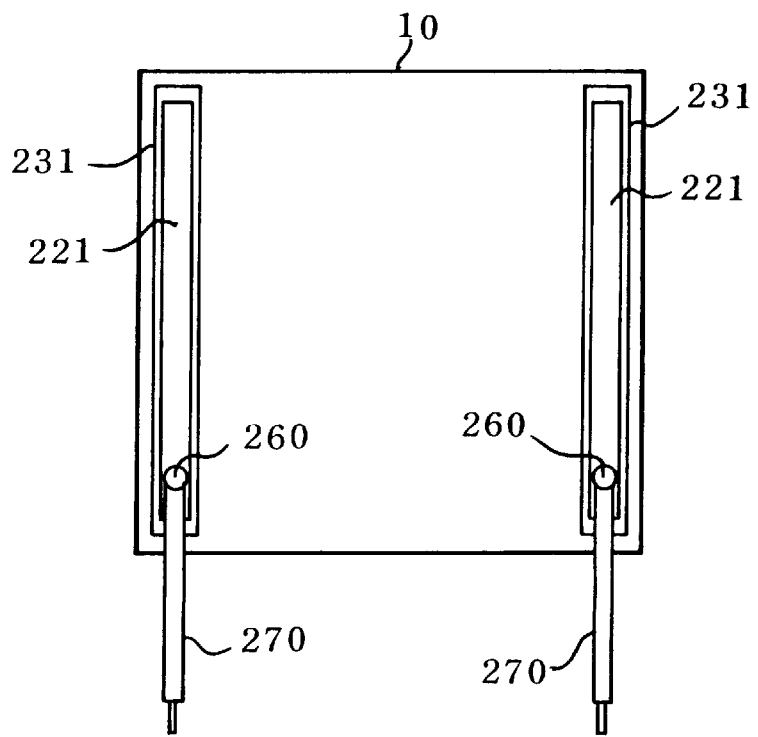
FIG. 14 is a backside view of FIG. 13.
Figure 15:
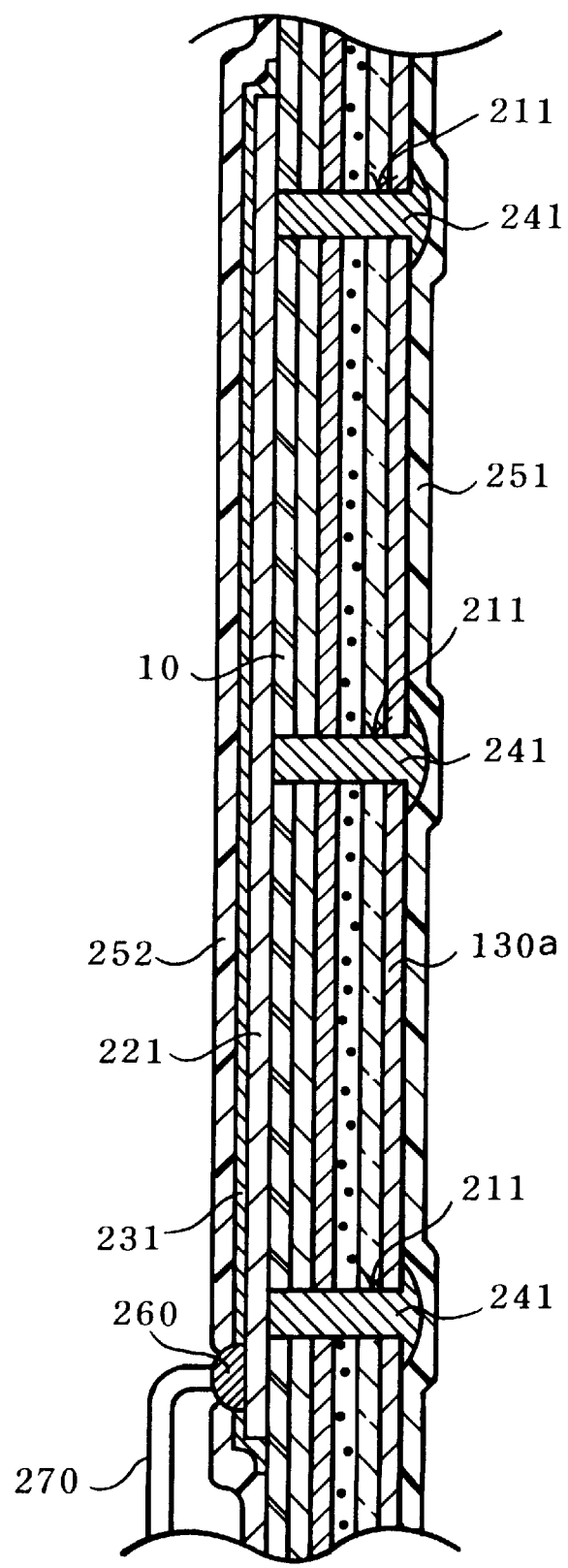
FIG. 15 is an enlarged cross-section view at location A—A in FIG. 13.
Figure 16:
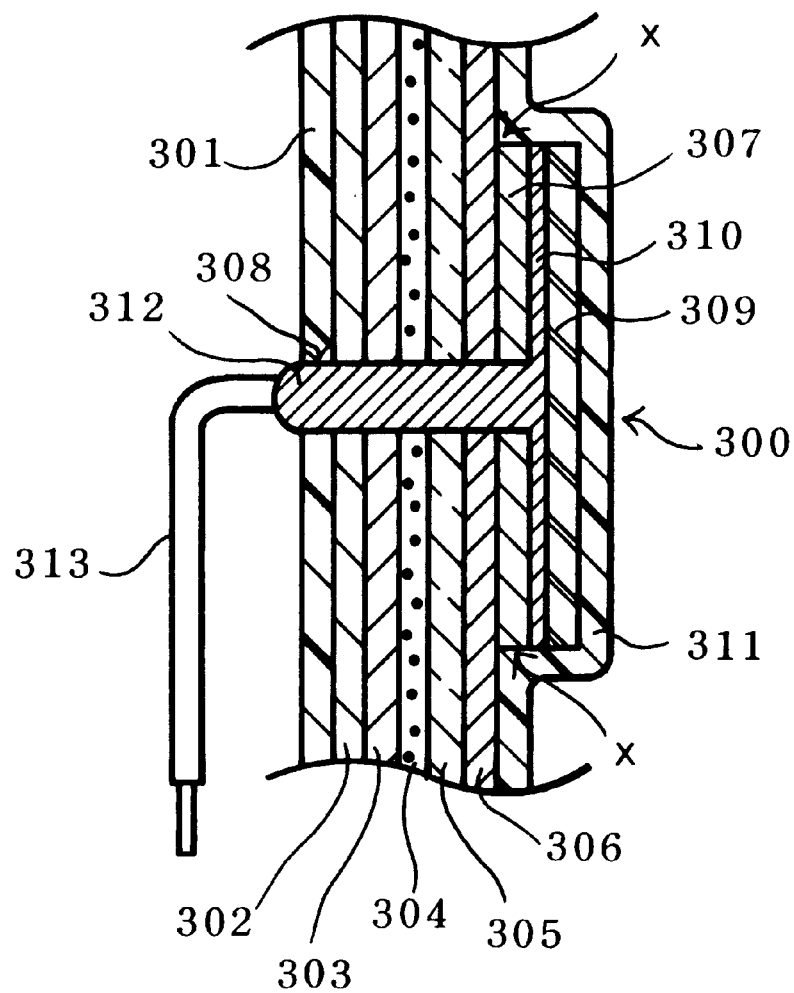
FIG. 16 is a cross-section view showing a prior art solar battery output section.

The third embodiment of the present invention is described using FIGS. 13 through 15. Here, descriptions concerning elements which are the same as the first embodiment are omitted and only elements which differ are described. In addition, since the right end solar battery output section and the left end solar battery output section have the same structure, only the left end solar battery output section cross-sectional structure is described in FIG. 15. As shown in FIGS. 13 and 14, holes 211 are provided through the substrate 10 at three locations along each of the output terminals 130a and 130c which extend parallel to the side ends of the substrate 10. On the backside of the substrate 10, band-shaped strips of metal foil 221 approximately the same length as the output terminals 130a and 130c are disposed covering the holes 211. Band-shaped strips of adhesive tape 231 are disposed over the metal foil 221 to fix the metal foil 221 in position. As a result of this structure, a low resistance metal foil 221 is electrically connected to the output terminals 130a and 130c through a plurality of holes 211 filled with conducting material 241. Therefore, resistive loss is reduced and power output can be efficiently extracted. Finally, even if, for example, the electrical connection between the conducting material 241 and the metal foil 221 fails in one region, output can be extracted if the remaining electrical connections between the conducting material 241 and the metal foil 221 are good.

As this invention may be embodied in several forms without departing from the spirit of essential characteristics thereof, the present embodiment is therefore illustrative and not restrictive. The scope of the invention is defined by the appended claims rather than by the description preceding them, and all changes that fall within the meets and bounds of the claims or equivalence of such meets and bounds thereof are therefore intended to be embraced by the claims.

What is claimed is:

1. A solar battery output apparatus comprising:
   an insulating substrate having a front surface and a back surface;
   a solar battery device including an amorphous silicon semiconductor layer;
   an output terminal for collecting an output from said solar battery device, said output terminal and said solar battery device being formed on said front surface of said substrate;
   a through-hole extending through said output terminal, through said solar battery device, and through said substrate;
   a metal foil portion positioned on said back surface of said substrate so as to cover said through-hole;

conducting material provided in said through-hole so as to electrically connect said solar battery device and said metal foil portion;

a protective resin film covering said substrate including said output terminal and said solar battery device; and a wire lead connected by solder to said metal foil portion at a connection point offset from said through-hole so as to conduct little heat from said connection point to said protective resin film.

2. The apparatus of claim 1, wherein said metal foil portion has a solder-plated surface.

3. The apparatus of claim 1, wherein said metal foil portion comprises copper foil.

4. The apparatus of claim 1, further comprising adhesive tape, wherein said metal foil portion is attached to said back surface of said substrate by said adhesive tape.

5. The apparatus of claim 4, wherein said adhesive tape comprises a transparent film including one surface having an adhesive layer thereon.

6. The apparatus of claim 1, wherein said output terminal includes a surface and said conducting material includes a head at said surface of said output terminal, said head including a peripheral portion extending outward from said through-hole and attached to said surface of said output terminal.

7. The apparatus of claim 6, wherein said head of said conducting material further includes a central portion and a thickness, wherein said thickness of said head gradually decreases between said central portion and said peripheral portion.

8. The apparatus of claim 1, wherein said protective resin film has a surface including an adhesion layer, wherein said adhesion layer plasticizes when heated.

9. The apparatus of claim 8, wherein said adhesion layer comprises ethylene-vinyl acetate copolymer (EVA).

10. The apparatus of claim 8, wherein said adhesion layer comprises PVB.

11. The apparatus of claim 1, wherein said conducting material comprises silver epoxy.

12. The apparatus of claim 1, wherein said through-hole has a circular cross-sectional configuration.

13. The apparatus of claim 1, wherein said output terminal comprises conducting epoxy.

14. The apparatus of claim 13, wherein said output terminal comprises silver epoxy.

15. The apparatus of claim 1, wherein said substrate is encapsulated within said protective resin film.

16. A solar battery output apparatus comprising:

an insulating substrate having a front surface and a back surface;

a plurality of output terminals formed on said front surface of said substrate, wherein each of said output terminals has at least one through-hole extending through said output terminal and said substrate, and wherein a single metal foil portion covers said through-holes of each of said output terminals;

conducting material provided in said at least one through-hole so as to electrically connect each of said output terminals and said metal foil portion;

a protective resin film covering said substrate including said output terminal; and a wire lead connected by solder to said metal foil portion at a point offset from said at least one through-hole.

17. A method of manufacturing a solar battery output apparatus, comprising:

forming an output terminal and a solar battery device on a front surface of an insulating substrate, said solar battery device including an amorphous silicon semiconductor layer;

forming a through-hole through the output terminal, through the solar battery device, and through the substrate;

providing a metal foil portion on a back surface of the substrate such that the metal foil portion covers the through-hole;

filling the through-hole with conducting material so as to electrically connect the solar battery device and the metal foil portion;

applying a protective resin film over the substrate including the output terminal; and connecting a wire lead by solder to the metal foil portion after applying the protective resin film, said connecting of the wire lead comprising connecting the wire lead to a connection point offset from the through-hole so as to conduct little heat from the connection point to the protective resin film.

18. The method of claim 17, wherein said providing of the metal foil portion comprises providing a metal foil portion including a solder-plated surface.

19. The method of claim 17, wherein said providing of the metal foil portion comprises providing a metal foil portion comprising copper foil.

20. The method of claim 17, wherein said providing of the metal foil portion comprises attaching the metal foil portion by adhesive tape.

21. The method of claim 20, wherein said attaching of the metal foil portion by adhesive tape comprises attaching the metal foil portion by adhesive tape comprising a transparent film including one surface having an adhesive layer thereon.

22. The method of claim 17, wherein said filling of the through-hole with conducting material includes forming a head of the conducting material at a surface of the output terminal, the head including a peripheral portion extending outward from the through-hole and attached to the surface of the output terminal.

23. The method of claim 22, wherein said forming of the head of the conducting material includes gradually tapering a thickness of the head from a thicker central portion of the head to a thinner peripheral portion of the head.

24. The method of claim 17, wherein said applying of the protective resin film comprises applying the protective resin film including a side having an adhesion layer thereon, wherein the adhesion layer plasticizes when heat is applied.

25. The method of claim 24, wherein said applying of the protective resin film comprises applying the protective resin film including the adhesion layer comprising ethylene-vinyl acetate copolymer (EVA).

26. The method of claim 24, wherein said applying of the protective resin film comprises applying the protective resin film including the adhesion layer comprising PVB.

27. The method of claim 17, wherein said filling of the through-hole with conducting material comprises filling the through-hole with conducting material comprising silver epoxy.

28. The method of claim 17, wherein said forming of the through-hole through the output terminal and the substrate comprises forming a circular through-hole.

29. The method of claim 17, wherein said applying of the protective resin film comprises applying the protective resin film so as to encapsulate the substrate.

* * * * *